United States Patent
Jun et al.

(10) Patent No.: US 8,916,767 B2
(45) Date of Patent: Dec. 23, 2014

(54) SOLAR CELL AND METHOD OF FABRICATING THE SAME

(75) Inventors: Gug-Il Jun, Hwaseong-si (KR); Woo-Su Lee, Asan-si (KR); Dong-Seop Kim, Seoul (KR); Jin-Seock Kim, Cheonan-si (KR); Byoung-Dong Kim, Asan-si (KR); Kang-Hee Lee, Hwaseong-si (KR); Dong-Gi Ahn, Seoul (KR); Byung-Joo Lee, Seoul (KR); Hyoung-Jin Park, Seoul (KR); In-Ki Kim, Seoul (KR)

(73) Assignees: Samsung SDI Co., Ltd., Yongin-Si, Gyeonggi-Do (KR); Samsung Display Co., Ltd., Yongin, Gyeonggi-Do (KR)

( * ) Notice: Subject to any disclaimer, the term of this patent is extended or adjusted under 35 U.S.C. 154(b) by 1223 days.

(21) Appl. No.: 12/635,660

(22) Filed: Dec. 10, 2009

(65) Prior Publication Data

US 2010/0154872 A1    Jun. 24, 2010

(30) Foreign Application Priority Data

Dec. 23, 2008    (KR) .................. 10-2008-0132465

(51) Int. Cl.
*H01L 31/00*    (2006.01)
*H01L 21/00*    (2006.01)
(Continued)

(52) U.S. Cl.
CPC ............... *C23C 14/14* (2013.01); *Y02E 10/541* (2013.01); *H01L 31/03923* (2013.01); *Y02E 10/544* (2013.01); *Y02E 10/52* (2013.01); *C23C 14/5866* (2013.01); *H01L 31/065* (2013.01); *H01L 31/0322* (2013.01)
USPC ........................................... 136/252; 438/84

(58) Field of Classification Search
CPC    C23C 14/14; C23C 14/5866; H01L 31/0322; H01L 31/1852; H01L 31/065; H01L 31/03923; Y02E 10/544; Y02E 10/52; Y02E 10/541
USPC ..................... 136/252; 438/84; 257/E31.015, 257/E21.068
See application file for complete search history.

(56) References Cited

U.S. PATENT DOCUMENTS 5,981,868 A * 11/1999 Kushiya et al. ............... 136/262
6,048,442 A * 4/2000 Kushiya et al. .......... 204/192.28
(Continued)

FOREIGN PATENT DOCUMENTS

KR    10-2007-0099575 A    10/2007

OTHER PUBLICATIONS

Basol, B.M. et al., "Studies on Sulfur Diffusion into Cu(In,Ga)Se2 Thin Films", Progress in Photovoltaics: Research and Applications, John Wiley & Sons, 2000, 8: pp. 227-235.*

(Continued)

Primary Examiner — Tamir Ayad
(74) Attorney, Agent, or Firm — Lee & Morse, P.C.

(57) ABSTRACT

A solar cell and a method of fabricating the same are provided according to one or more embodiments. According to an embodiment, the solar cell includes a substrate, a back electrode layer formed on the substrate, a light absorbing layer formed on the back electrode layer, and a transparent electrode layer formed on the light absorbing layer, wherein the light absorbing layer is comprised of copper (Cu), gallium (Ga), indium (In), sulfur (S), and selenium (Se) and includes a first concentration region in which concentrations of sulfur (S) gradually decrease in the light absorbing layer going in a first direction from the back electrode layer to the transparent electrode layer.

15 Claims, 7 Drawing Sheets

(51) Int. Cl.
*H01L 31/0392* (2006.01)
*C23C 14/58* (2006.01)
*H01L 31/065* (2012.01)
*C23C 14/14* (2006.01)
*H01L 31/032* (2006.01)

(56) References Cited

U.S. PATENT DOCUMENTS

| | | | |
|---|---|---|---|
| 6,323,417 B1* | 11/2001 | Gillespie et al. | 136/262 |
| 7,442,413 B2* | 10/2008 | Zwaap et al. | 427/248.1 |
| 2007/0257255 A1* | 11/2007 | Dhere et al. | 257/40 |
| 2008/0210295 A1 | 9/2008 | Basol | |
| 2008/0302413 A1* | 12/2008 | Leidholm et al. | 136/252 |
| 2008/0305269 A1* | 12/2008 | Sager et al. | 427/383.3 |

OTHER PUBLICATIONS

Kuriyagawa et al.—English machine translation of KR-10-2007-0099575 A, publication date Oct. 9, 2007.*

Rafat et al. The Limiting Efficiency of Band Gap Graded Solar Cells, Solar Energy Materials & Solar Cells, 55, 1998, pp. 341-361.

Bar et al. Determination of the Band Gap Depth Profile of the Penternary, etc., Journal of Applied Physics, vol. 96, No. 7, Oct. 1, 2004.

Kushiya et al. The Role of Cu(inGa)(SeS)2, Surface Layer on a Graded Band-Gap, etc., IEEE, 25$^{th}$ PVSC; May 13-17, 1996, pp. 989-992.

T. Dullweber, Back Surface Band Gap Gradings in Cu(In,Ga)Se2 Solar Cells, Thin Solid Films 387 2001, pp. 11-13.

* cited by examiner

SOLAR CELL AND METHOD OF FABRICATING THE SAME

CROSS-REFERENCE TO RELATED APPLICATION

This application claims priority to and benefit from Korean Patent Application No. 10-2008-0132465 filed on Dec. 23, 2008 in the Korean Intellectual Property Office, the disclosure of which is incorporated herein by reference in its entirety.

BACKGROUND

1. Technical Field

The present invention generally relates to a solar cell and a method of fabricating the same, and more particularly, to a solar cell having improved efficiency.

2. Description of the Related Art

Solar cells or photovoltaic cells are essential devices for photovoltaic generation for converting sunlight directly into electrical power and are generally fabricated using a semiconductor having a p-n junction region. When sunlight with energy greater than the band-gap energy (Eg) of a semiconductor projects onto a solar cell, the energy generates electron-hole pairs on a p-n junction region. Electrons gather in an n-type layer and holes gather in a p-type layer by an electric field generated across the p-n junction region, creating electric power at the p-n junction. When electric charges are applied to opposite terminals of the solar cell, a current will flow.

Recently, due to problems associated with greenhouse gas generated by fossil fuel, alternative energy sources (e.g., sunlight) are receiving much attention. Among the devices that utilize an alternative energy source are solar cells for generating electricity from sunlight. However, a conventional solar cell still has several disadvantages to be solved, including poor photoelectric conversion efficiency.

In the conventional solar cell fabrication technique, in order to increase an open circuit voltage defined as the solar cell efficiency, an attempt to form a concentration gradient of a particular elemental constituent of the solar cell has been proposed. However, in the course of fabricating solar cells, various side reactions may occur to raw materials used for forming a back electrode layer and a light absorbing layer, deteriorating adhesion between the back electrode layer and the light absorbing layer and ultimately lowering the stability of the solar cell. In order to minimize occurrence of such side reactions, which are sensitive to temperature, it is necessary to lower the processing temperature of a heat treatment for forming the light absorbing layer. This attempt may, however, degrade characteristics of the finally obtained light absorbing layer, which is undesirable.

SUMMARY

Embodiments of the present invention provide a solar cell having improved photoelectric conversion efficiency and ensured stability.

Embodiments of the present invention also provide a method of fabricating a solar cell capable of providing for a concentration gradient of a particular elemental constituent to a light absorbing layer of the solar cell while suppressing side reactions, which may be accompanied with the manufacture of the solar cell.

According to an embodiment of the present invention, there is provided a solar cell including a substrate, a back electrode layer formed on the substrate, a light absorbing layer formed on the back electrode layer, and a transparent electrode layer formed on the light absorbing layer, wherein the light absorbing layer is comprised of copper (Cu), gallium (Ga), indium (In), sulfur (S), and selenium (Se) and includes a first concentration region in which concentrations of sulfur (S) gradually decrease in a first direction from the back electrode layer to the light absorbing layer.

According to another embodiment of the present invention, there is provided a method of fabricating a solar cell, the method including forming a back electrode layer formed on the substrate, forming a light absorbing layer on the back electrode layer, and forming a transparent electrode layer on the light absorbing layer, wherein the light absorbing layer includes a first concentration region in which concentrations of sulfur (S) gradually decrease in a first direction from the back electrode layer to the light absorbing layer.

BRIEF DESCRIPTION OF THE DRAWINGS

The above and other features and advantages of the present disclosure will become more apparent by describing in detail embodiments thereof with reference to the attached drawings in which.

DETAILED DESCRIPTION

Figure 1:
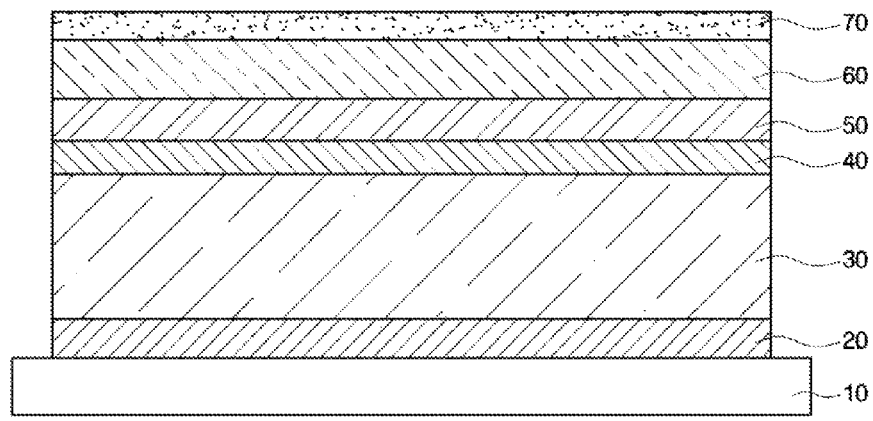
FIG. 1 is a cross-sectional view of a solar cell according to an exemplary or a modified embodiment of the present invention.

Advantages and features of the present disclosure and methods of accomplishing the same may be understood more readily by reference to the following detailed description of one or more embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the disclosure to those skilled in the art, and the present disclosure will only be defined by the appended claims. Like reference numerals refer to like elements throughout the specification. In the drawings, the thicknesses of layers and regions are exaggerated for clarity.

It will be understood that when an element or layer is referred to as being "on" another element or layer, it can be directly on the other element or layer, or intervening elements or layers may be present. In contrast, when an element is referred to as being "directly on" another element or layer, there are no intervening elements or layers present. As used herein, the term "and/or" includes any and all combinations of one or more of the associated listed items.

Spatially relative terms, such as "below," "beneath," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Exemplary embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, exemplary embodiments of the present invention should not be construed as limited to the particular shapes of regions illustrated herein but are to include deviations in shapes that result, for example, from manufacturing.\

Hereinafter, solar cells according to embodiments of the present invention will be described in detail with reference to the accompanying drawings.

Figure 2A:
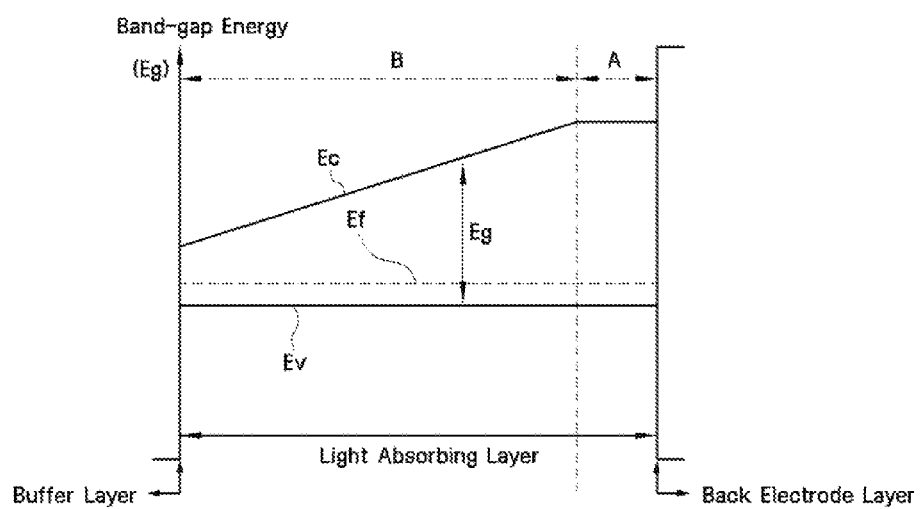
FIG. 2A illustrates a profile of the band-gap energy of a light absorbing layer in the solar cell shown in FIG. 1 according to the exemplary embodiment of the present invention.
Figure 2:
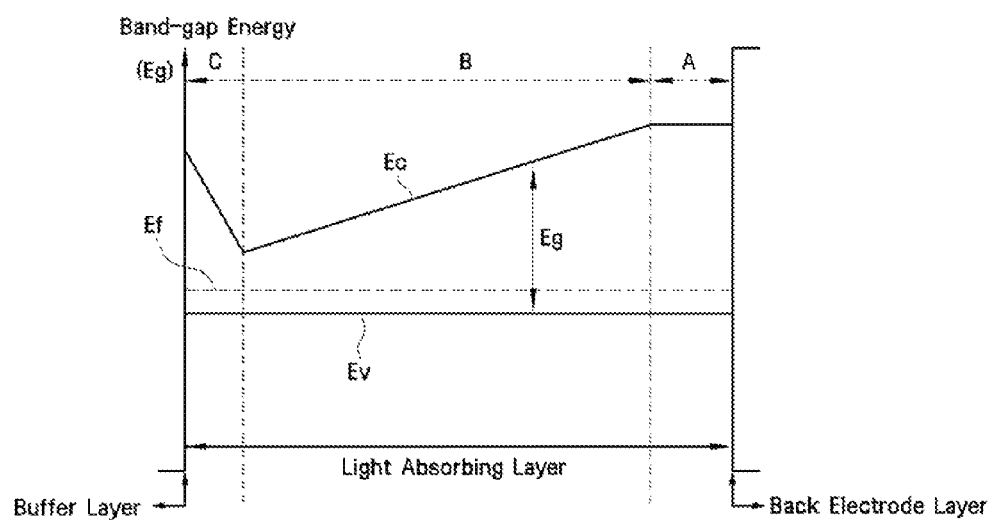
FIG. 2B illustrates a profile of the band-gap energy of a light absorbing layer in the solar cell shown in FIG. 1 according to the modified embodiment of the present invention.
Figure 3A:
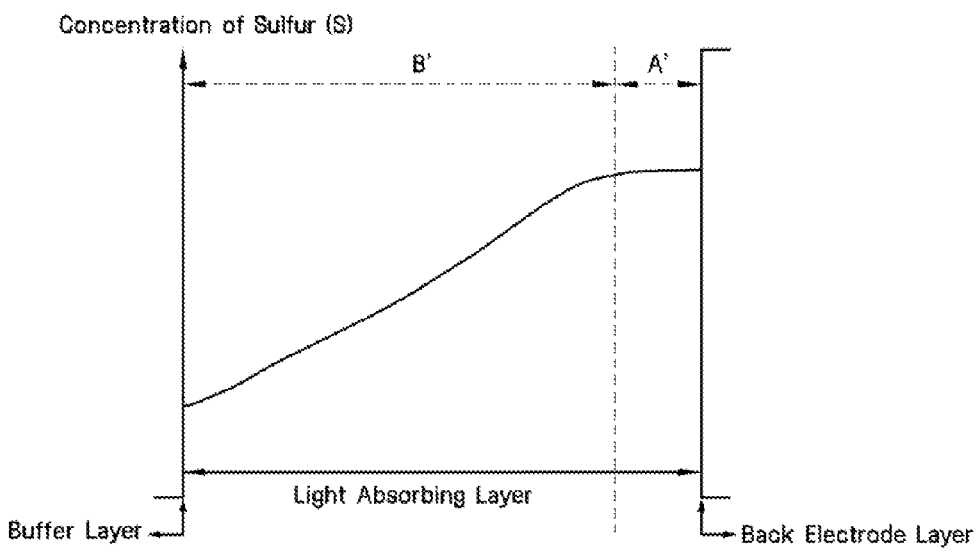
FIG. 3A illustrates a profile of the concentration of sulfur (S) of the light absorbing layer having the band-gap energy profile illustrated in FIG. 2A according to an embodiment.
Figure 3B:
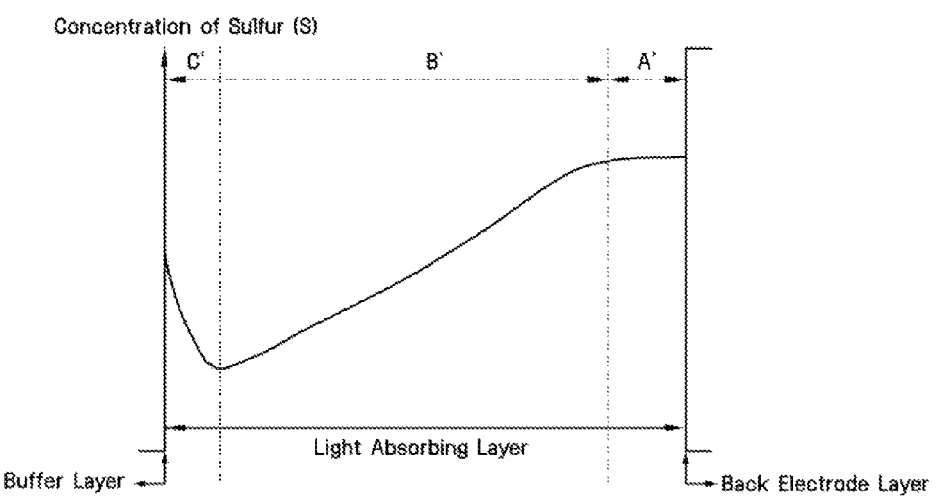
FIG. 3B illustrates a profile of the concentration of sulfur (S) of the light absorbing layer having the band-gap energy profile illustrated in FIG. 2B according to an embodiment.

A solar cell according to an exemplary or modified embodiment of the present invention will now be described in detail with reference to FIGS. 1 through 3B. FIG. 1 is a cross-sectional view of a solar cell according to an exemplary or modified embodiment of the present invention, FIG. 2A illustrates a profile of the band-gap energy of a light absorbing layer in the solar cell shown in FIG. 1 according to the exemplary embodiment of the present invention, FIG. 2B illustrates a profile of the band-gap energy of a light absorbing layer in the solar cell shown in FIG. 1 according to the modified embodiment of the present invention, FIG. 3A illustrates a profile of the concentration of sulfur (S) of the light absorbing layer having the band-gap energy profile illustrated in FIG. 2A according to an embodiment, and FIG. 3B illustrates a profile of the concentration of sulfur (S) of the light absorbing layer having the band-gap energy profile illustrated in FIG. 2B according to an embodiment.

Referring to FIG. 1, the solar cell according to an embodiment of the present invention comprises a substrate 10, a back electrode layer 20, a light absorbing layer 30, a buffer layer 40, a window layer 50, a transparent electrode layer 60, and an anti-reflective layer 70.

As the substrate 10 used for a solar cell, glass having an insulating property is generally used. In particular, soda lime glass may be used as the substrate 10. In the course of fabricating the solar cell, sodium (Na) contained in the soda lime glass substrate 10 may be diffused into the light absorbing layer 30 comprised of a copper (Cu)-indium (In)-gallium (Ga)-sulfur (S)-selenium (Se) (CIGSS) compound, which may increase a charge concentration of the light absorbing layer 30 comprised of the CIGSS compound. This may lead to an increase in the photoelectric conversion efficiency of the solar cell. Thus, in order to increase the photoelectric conversion efficiency of the solar cell having a light absorbing layer formed of CIGSS, soda lime glass may be advantageously used as the substrate 10. In addition to soda lime glass, alternative usable substrates include but are not limited to ceramics such as alumina, metals such as stainless steel, flexible resins, and the like.

The back electrode layer 20 allows for movement of charges generated from the light absorbing layer 30 of the solar cell, so that a current flows to the outside of the solar cell. To perform this function, the back electrode layer 20 may have high electric conductivity and low specific resistivity. Since the back electrode layer 20 contacts the CIGSS compound forming the light absorbing layer 30, a structure having a low contact resistance value, i.e., an ohmic contact, may be formed between the CIGSS compound (a P-type semiconductor) and the metallic back electrode layer 20. In addition, the back electrode layer 20 may maintain stability at a high temperature during heat treatment performed under an atmosphere containing sulfur (S) or selenium (Se), which is accompanied by the forming of the CIGSS compound. Furthermore, in order to prevent the back electrode layer 20 from being peeled off from the substrate 10 due to a difference in the thermal expansion coefficient between the substrate 10 and the back electrode layer 20, the back electrode layer 20 may be highly adhesive to the substrate 10. The back electrode layer 20 may be made of at least one selected among molybdenum (Mo), gold (Au), aluminum (Al), copper (Cu) and so on. Particularly, molybdenum (Mo) is a material capable of satisfying the requirements of the back electrode layer 20.

In the exemplary embodiment of the present invention, the light absorbing layer 30 may be comprised of a copper (Cu)-indium (In)-gallium (Ga)-sulfur (S)-selenium (Se) (CIGSS) compound. The CIGSS compound is also called a chalcopyrite-based compound, which has p-type semiconductor properties. The CIGSS compound semiconductor has a band-gap of a direction transition type of energy. In addition, since the CIGSS compound semiconductor has an optical absorption coefficient of $1 \times 10^5$ cm$^{-1}$, which is a highest level among semiconductor materials, it is capable of fabricating highly efficient solar cells of a thin film having a thickness of several micrometers. Furthermore, the CIGSS compound exhibits electro optical stability for a prolonged period.

In the solar cell according to one or more embodiments of the present invention, the light absorbing layer 30 comprises a pentanary compound of copper (Cu), indium (In), gallium (Ga), sulfur (S) and selenium (Se), represented by $Cu_x(Ga_yIn_{1-y})(S_zSe_{1-z})_2$ (where $0.75 \leq x \leq 1$, $0.1 \leq y \leq 0.3$, and $0.7 \leq z < 1$). Here, the $Cu_x(Ga_yIn_{1-y})(S_zSe_{1-z})_2$ (where $0.75 \leq x \leq 1$, $0.1 \leq y \leq 0.3$, and $0.7 \leq z < 1$) compound has a crystalline lattice structure in which indium (In) is replaced partially with gallium (Ga), and elemental sulfur (S) is replaced partially with selenium (Se).

In the solar cell according to the exemplary embodiment of the present invention, the band-gap energy of the light absorbing layer 30 will be described with reference to FIG. 2A, in which $E_v$ indicates a valence energy band, and Ec indicates a conduction energy band. The band-gap energy Eg is an energy gap between the conduction energy band Ec and the valence energy band Ev.

In general, if the band-gap energy Eg near the back electrode layer 20 is high, it makes recombination of electron-hole pairs in a light absorbing layer difficult, thereby improving the efficiency of a solar cell. In addition, if the band-gap energy Eg near the back electrode layer 20 is high, an open circuit voltage Voc of a solar cell may be increased and the efficiency of the solar cell may be improved.

Here, the open circuit voltage Voc is a potential difference between opposite ends of the solar cell when light is irradiated with infinite impedance applied. The open circuit voltage Voc is the maximum voltage that may be obtained from the solar cell. If an open circuit current is much smaller than a short circuit current, the open circuit voltage Voc is generally proportional to the intensity of incident light. In a state in which a p-n junction is formed properly, the higher the band-gap energy of a semiconductor, the greater the open circuit voltage Voc. If the band-gap energy Eg is increased, the current gradually decreases in an open state and the open circuit voltage Voc is increased.

Thus, the band-gap energy Eg may be increased at an interface of the light absorbing layer 30 and the back electrode layer 20, thereby preventing recombination, increasing the open circuit voltage Voc, and finally improving the overall conversion efficiency of the solar cell.

In FIG. 2A, a region 'A' is a region of the light absorbing layer 30 adjacent to the back electrode layer 20. Thus, the band-gap energy Eg is highest in the region A.

A region 'B' is a region of the light absorbing layer 30 extending from the region A away from the back electrode layer 20, into an interior region of the light absorbing layer 30. In the region B, the band-gap energy Eg tends to gradually decrease with distance from the back electrode layer 20. In order to allow electrons to be easily excited from the valence band to the conduction band upon absorption of sunlight, the band-gap energy Eg in the region B is smaller than that in the region A, that is, the region of the light absorbing layer 30 adjacent to the back electrode layer 20, in view of photovoltaic effect. If the band-gap energy Eg in the region B is relatively high, like in the region A, electrons are not easily excited from the valence band to the conduction band, lowering the overall conversion efficiency of the solar cell.

In the solar cell according to the modified embodiment of the present invention, the band-gap energy of the light absorbing layer 30 will be described with reference to FIG. 2B, in which regions A and B are the same as those of FIG. 2A, and a repetitive explanation thereabout will not be given.

In FIG. 2B, a region 'C' indicates a region of the light absorbing layer 30 adjacent to the buffer layer 40. The region C corresponds to an interface between the light absorbing layer 30 and the buffer layer 40 of an n-type semiconductor. In order to prevent electrons generated in the region C from being recombined with holes, the band-gap energy Eg in region C may be increased.

Meanwhile, the profile of the band-gap energy Eg in the light absorbing layer 30 may be formed by adjusting the concentration of gallium (Ga). In the CIGSS compound semiconductor according to one or more embodiments of the present invention, the profile of the band-gap energy Eg in the light absorbing layer 30 may be formed by adjusting the concentration of sulfur (S).

The profiles of the band-gap energy Eg formed in the light absorbing layer 30 and the profiles of the concentration of sulfur (S) according to the exemplary and modified embodiments of the present invention will be described with reference to FIGS. 2A through 3B.

In the solar cell according to one or more embodiments of the present invention, the light absorbing layer 30 is comprised of $Cu_x(Ga_yIn_{1-y})(S_zSe_{1-z})_2$ (where $0.75 \leq x \leq 1$, $0.1 \leq y \leq 0.3$, and $0.7 \leq z < 1$). In the CIGSS compound, the y value indicates a proportion of indium (In) partially replaced with gallium (Ga).

Referring to FIG. 3A, the light absorbing layer 30 includes a first concentration region B' in which the concentrations of sulfur (S) gradually decrease in the first direction from the back electrode layer 20 to the light absorbing layer 30. That is to say, in the $Cu_x(Ga_yIn_{1-y})(S_zSe_{1-z})_2$ (where $0.75 \leq x \leq 1$, $0.1 \leq y \leq 0.3$, and $0.7 \leq z < 1$) compound of the light absorbing layer 30, values of z gradually decrease in the first direction within the first concentration region B'.

The profile of the band-gap energy Eg shown in FIG. 2A corresponds to the profile of the concentrations of sulfur (S) shown in FIG. 3A. That is to say, the band-gap energy Eg is generally a smaller value in a region with a smaller concentration of sulfur (S), and vice versa. The light absorbing layer 30 according to one or more embodiments of the present invention includes the first concentration region B' in which values of the band-gap energy Eg will gradually decrease in the first direction since the concentrations of sulfur (S) gradually decrease in the first direction. Accordingly, the light absorbing layer 30 in the first concentration region B' allows electrons to be easily excited from the valence band to the conduction band upon absorption of sunlight, thereby improving the overall conversion efficiency of the solar cell.

Referring to FIG. 3B, the light absorbing layer 30 includes a second concentration region C' in which the concentrations of sulfur (S) gradually increase between the first concentration region B' and the buffer layer 40. That is to say, in the $Cu_x(Ga_yIn_{1-y})(S_zSe_{1-z})_2$ (where $0.75 \leq x \leq 1$, $0.1 \leq y \leq 0.3$, and $0.7 \leq z < 1$) compound of the light absorbing layer 30, values of z gradually increase in the first direction within the second concentration region C'.

Since the second concentration region C' of the light absorbing layer 30 according to one or more embodiments of the present invention has the second concentration region C' in which the concentrations of sulfur (S) gradually increase in the first direction, the band-gap energy Eg gradually increases in the first direction, as shown in FIG. 2B. Accordingly, in the light absorbing layer 30 in the second concentration region B', recombination between excited electrons and holes may be minimized in the light absorbing layer 30, thereby improving the overall conversion efficiency of the solar cell.

Referring to FIGS. 3A and 3B, in the profiles of the concentrations of sulfur (S) of the light absorbing layer 30, a third concentration region A' corresponds to a region ranging between the first concentration region B' and the back electrode layer 40, in which the concentration of sulfur (S) is constant throughout the entire region. The third concentration region A' has a concentration of sulfur (S) that corresponds to the maximum among the concentrations of sulfur (S) of the first and second concentration regions B' and C'. That is to say, in the $Cu_x(Ga_yIn_{1-y})(S_zSe_{1-z})_2$ (where $0.75 \leq x \leq 1$, $0.1 \leq y \leq 0.3$, and $0.7 \leq z < 1$) compound of the light absorbing layer 30, values of z within the third concentration region A' approximate 1. Thus, the third concentration region A' of the light absorbing layer 30 according to one or more embodiments of the present invention has a higher concentration of sulfur (S) than the first and second concentration regions B' and C'. Accordingly, the band-gap energy Eg in the third concentration regions A' will be higher than in the first and second concentration regions B' and C'. Accordingly, recombination between excited electrons and holes occurs less frequently in the third concentration region A' of the light absorbing layer 30 than in the first and second concentration regions B' and C'. In addition, since the band-gap energy Eg is increased at the interface of the light absorbing layer 30 and the back electrode layer 20, the open circuit voltage Voc will be increased. Therefore, the overall conversion efficiency of the solar cell may also be improved.

The third concentration region A' corresponds to a first compound layer of the light absorbing layer 30, the first compound layer occupying about 2.5 to 5% of a thickness of the light absorbing layer 30, which will later be described in more detail.

Meanwhile, the first concentration region B', the second concentration region C' and the third concentration region A' representing profiles of concentrations of sulfur (S) correspond to the regions B, C and A of FIG. 2B, respectively. That is to say, the profiles of concentrations of sulfur (S) are substantially the same as the profiles of values of the band-gap energy Eg.

Referring to FIG. 1, the buffer layer 40 is positioned on the light absorbing layer 30. In a solar cell having a CIGSS compound, a pn junction is formed between a CIGSS compound film (i.e., p-type semiconductor) and a ZnO film (i.e., n-type semiconductor). In an exemplary embodiment of the present invention, a pn junction is formed between the light absorbing layer 30 and the window layer 50 or the transparent electrode layer 60. However, the CIGSS compound and ZnO are quite different from each other in their lattice constants and band-gap energy values. Thus, in order to form a good pn junction, the buffer layer 40 may further be provided between the CIGSS compound film and the ZnO film. Examples of materials for forming the buffer layer 40 include CdS, ZnS, and the like. In view of the efficiency of the solar cell, CdS may be provided according to an embodiment. A CdS film is an n-type semiconductor, and the CdS film with a low resistance value may be acquired by doping indium (In), gallium (Ga) or aluminum (Al) into the CdS film.

The window layer 50 is positioned on the buffer layer 40. The window layer 50 is an n-type semiconductor, and forms a pn junction together with the buffer layer 40 and the CIGSS compound. The window layer 50 is made of a material having high optical transmission so that sunlight passes through the light absorbing layer 30. In addition, the window layer 50 may be made of an electrically conducting material so as to function as an electrode layer. In order to obtain the function of the window layer 50, the window layer 50 may be made of zinc oxide (ZnO), which is an electrically conducting material and has band-gap energy of 3.3 eV and relatively high optical transmission of 80% or greater. The window layer 50 mainly employs intrinsic (non-conductive) i-ZnO without doping of an element of Group III or V of the Periodic Table.

The transparent electrode layer 60 is positioned on the window layer 50. The transparent electrode layer 60 is made of a material having high optical transmission so that sunlight passes through the light absorbing layer 30. In addition, the transparent electrode layer 60 may be made of a low-resistance, electrically conducting material so as to function as an electrode layer. Boron (B) or aluminum (Al) doped ZnO or indium tin oxide (ITO) may be used as the material for forming the transparent electrode layer 60. Since boron (B) or aluminum (Al) doped ZnO has resistance of $10^{-4}$ $\Omega$*cm or less, it may be suitably used as an electrode material. In particular, boron (B) doped ZnO increases the optical transmission of light in the near infrared ray region, thereby increasing the open circuit current of the solar cell.

An anti-reflective layer 70 may further be provided in the transparent electrode layer 60. In order to reduce reflection loss of sunlight incident on the solar cell, the anti-reflective layer 70 is formed on the transparent electrode layer 60, thereby improving the efficiency of the solar cell. The anti-reflective layer 70 may be made of $MgF_2$.

Next, a method of fabricating a solar cell according to the exemplary embodiment of the present invention will be described with reference to FIGS. 1 and 4A through 4I.

Figure 4A:
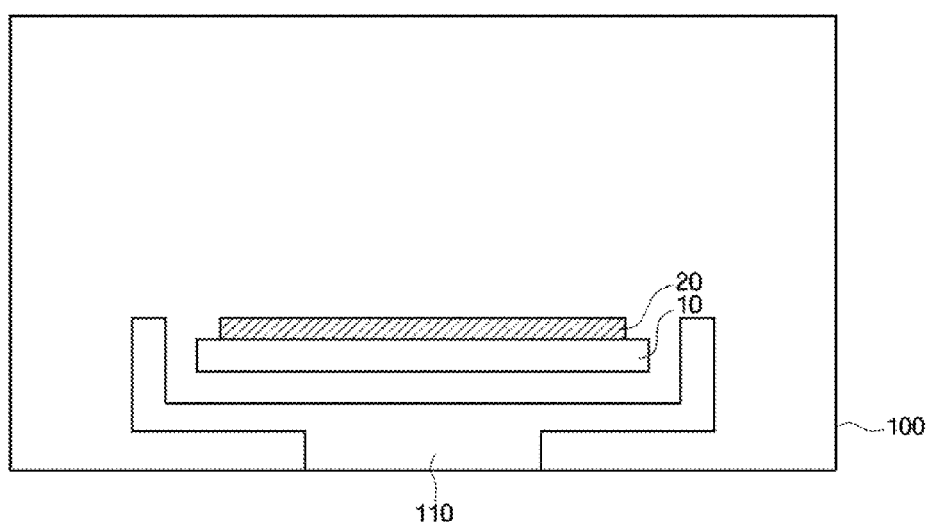
FIGS. 4A through 4I are cross-sectional views illustrating a method of fabricating a solar cell according to an embodiment of the present invention.

Referring to FIG. 4A, the back electrode layer 20 is formed on the substrate 10. As described above according to an embodiment, the back electrode layer 20 may be made of molybdenum (Mo), which is a material capable of satisfying the requirements of the back electrode layer 20. The back electrode layer 20 may be formed by DC sputtering using a molybdenum (Mo) target. In alternative embodiments, the back electrode layer 20 may be formed by chemical vapor deposition (CVD).

Figure 4B:
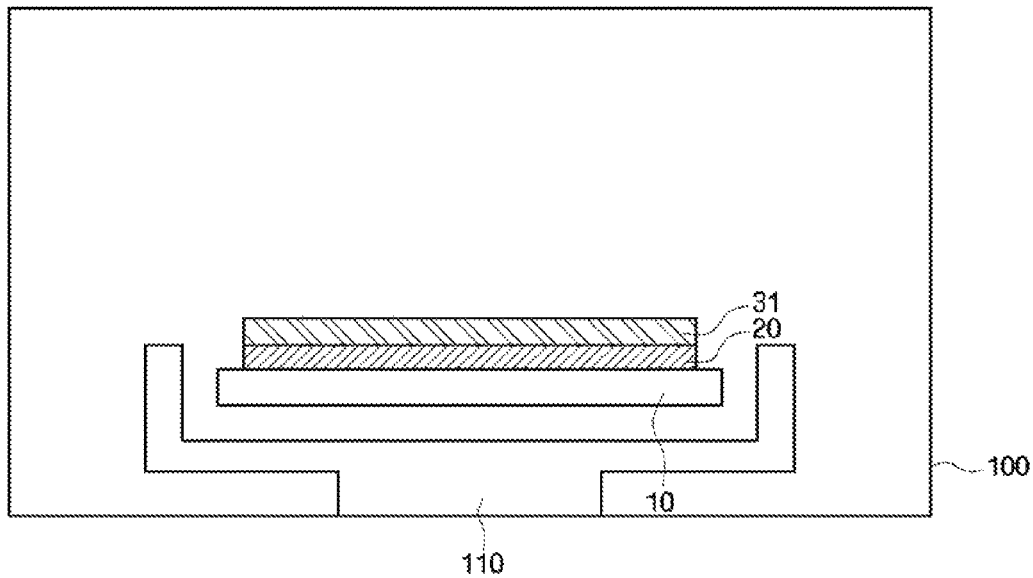

Referring to FIG. 4B, a Cu—Ga layer 31 may be formed on the back electrode layer 20. Here, the Cu—Ga layer 31 may be formed by DC sputtering using a Cu—Ga alloy target. Since elemental gallium (Ga) alone is not readily used as a target substance, the Cu—Ga alloy may be used as the target.

Figure 4C:
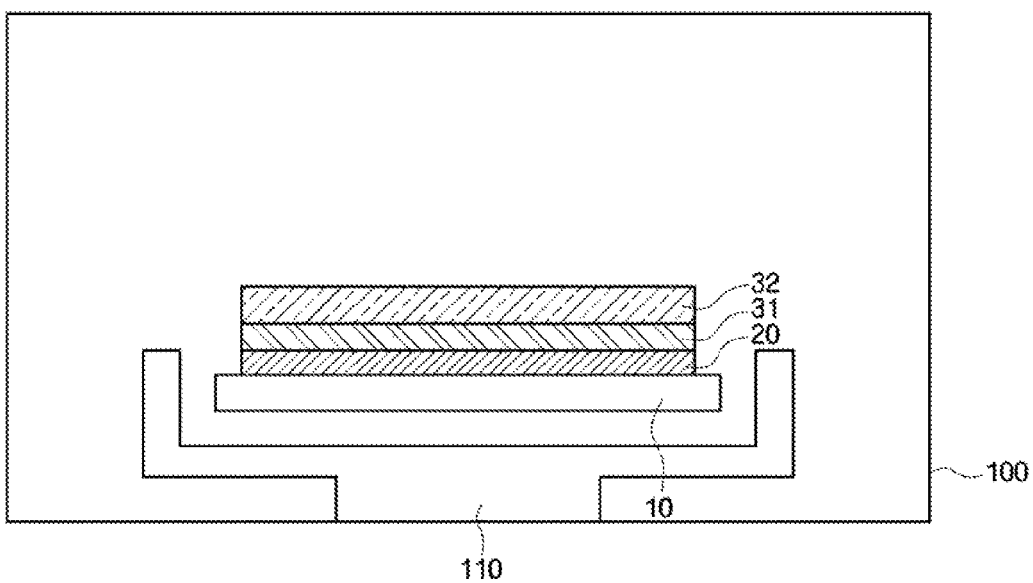

Referring to FIG. 4C, an In layer 32 may be formed on the Cu—Ga layer 31. The In layer 32 may be formed by sputtering using an indium (In) target.

Throughout the above-described process according to an embodiment, a first precursor consisting of the Cu—Ga layer 31 and the In layer 32 sequentially formed on the back electrode layer 20 may be completed. In this case, the first precursor may be formed in two steps in the above-described manner. However, the first precursor may also be formed by sputtering using a Cu—Ga—In alloy target. Here, the first precursor may be formed by a Cu—Ga—In layer (not shown).

Figure 4D:
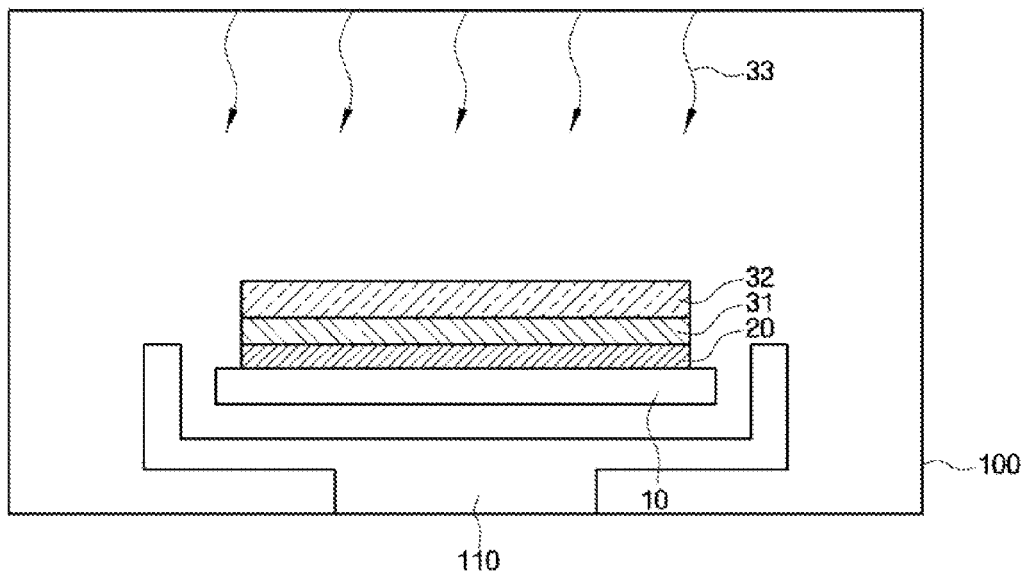
Figure 4E:
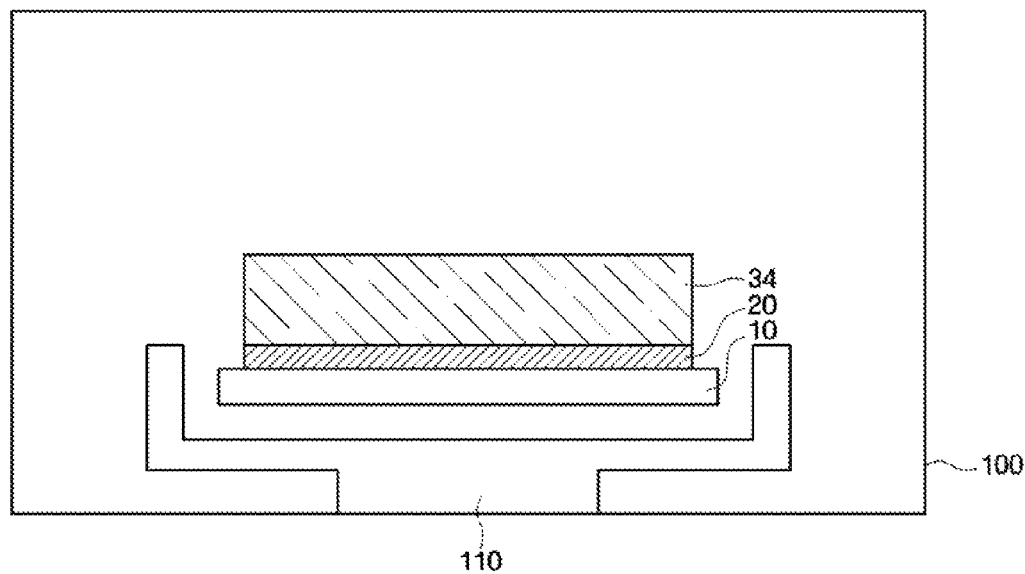

Referring to FIGS. 4D and 4E, the first precursor consisting of the Cu—Ga layer 31 and the In layer 32 may be subjected to first heat treatment using a sulfur (S) containing gas 33 to form a first compound layer 34.

To perform the first heat treatment, a chamber 100 for the first heat treatment may be maintained in a vacuum state.

Next, the S containing gas 33 is introduced into chamber 100. Here, the S containing gas 33 may include an inert gas and a hydrogen sulfide ($H_2S$) gas. In consideration of the band-gap energy Eg required at the interface with the back electrode layer 20 and the extent of excitation of electrons, the $H_2S$ gas in the sulfur (S) containing gas may have a flow ratio between about 10% and 20%. Within the range of the flow ratio stated above, a sufficiently high level of the band-gap energy Eg required at the interface with the back electrode layer 20 may be acquired. In addition, it is possible to prevent the band-gap energy Eg from overly increasing throughout the light absorbing layer 30, which is an advantageous feature for excitation of electrons.

In consideration of facilitated formation of a compound between the Cu—Ga layer 31 and the In layer 32 with the $H_2S$ gas and thermal deformation of a substrate, the first heat treatment may be performed in the chamber 100 maintained at a temperature between about 500 and about 600° C.

Meanwhile, the first heat treatment may be performed for about 10 to about 30 minutes. Within the processing time range, unreacted materials of the reaction between the first precursor and $H_2S$ gas may be reduced, and the processing time may also be shortened.

Through the first heat treatment, the first precursor consisting of the Cu—Ga layer 31 and the In layer 32 may be bonded with sulfur (S) to form the first compound layer 34 having a crystalline structure. The first compound layer 34 may be finally formed as a part of the light absorbing layer 30 according to one or more embodiments of the present invention in a subsequent process. The first compound layer 34 has a considerably high concentration of sulfur (S) based on the profile of the concentrations of sulfur (S) in the finally formed light absorbing layer 30. That is to say, the first compound layer 34 has the third concentration region A' shown in FIGS. 3A and 3B corresponding to the profile of the concentrations of sulfur (S) of the light absorbing layer 30.

In order to obtain a sufficient level of the band-gap energy Eg at the interface between the light absorbing layer 30 and the back electrode layer 20, a thickness of the first compound layer 34 may be about 2.5 to 5% of that of the light absorbing layer 30 to be completed in the subsequent process.

Figure 4F:
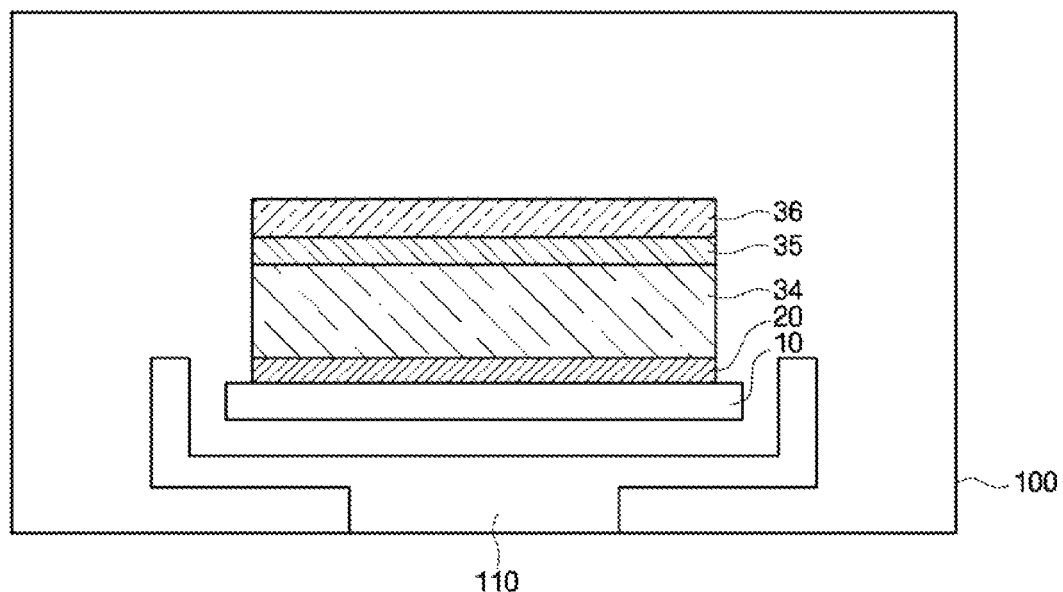

Referring to FIG. 4F, the Cu—Ga layer 35 may be formed on the first compound layer 34. Next, an In layer 36 or a Cu—Ga—In layer (not shown) may be formed on the Cu—Ga layer 35. Accordingly, the second precursor consisting of the Cu—Ga layer 35 and the In layer 36 may be completed. Since the method of the second precursor is substantially the same as the first precursor, a repetitive explanation thereabout will not be given.

Figure 4G:
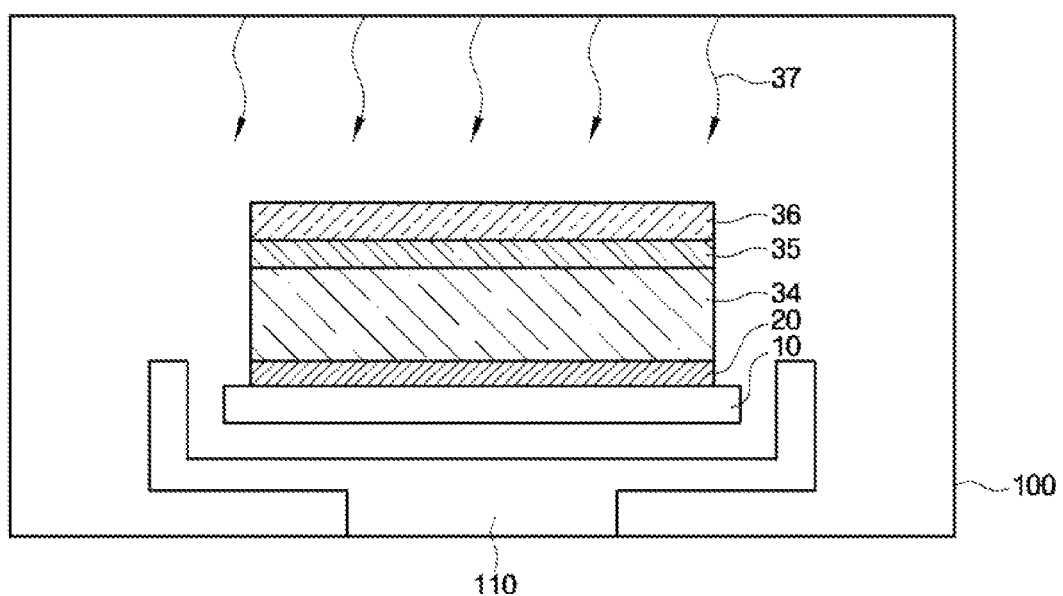
Figure 4H:
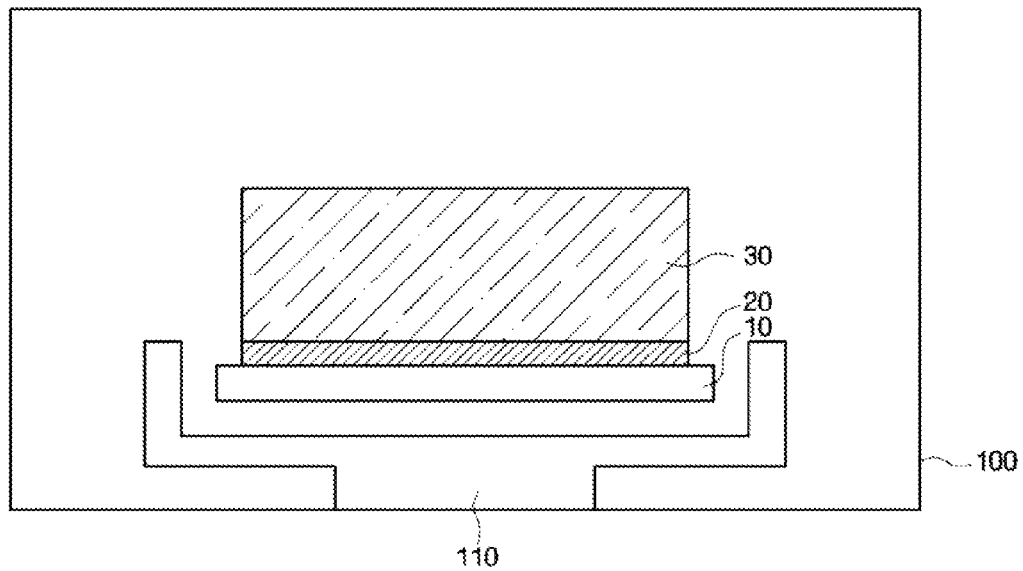

Referring to FIGS. 4G and 4H, the first compound layer 34 and the second precursor consisting of the Cu—Ga layer 35 and the In layer 36 may be subjected to a second heat treatment to form the light absorbing layer 30 using a selenium (Se) containing gas 37. To perform the second heat treatment, the chamber 100 for the second heat treatment may be maintained in a vacuum state.

Next, the Se containing gas 37 is introduced into chamber 100. Here, the Se containing gas 37 may include an inert gas and a hydrogen selenide ($H_2Se$) gas. The $H_2Se$ gas in the Se containing gas may have a flow ratio between about 3% and 10%. Within the range of the flow ratio stated above, the concentration of Se may be enough to be replaced partially with S in the crystalline lattice structure of the CIGSS compound.

In consideration of charge mobility of the CIGSS compound formed during the second heat treatment, the overall efficiency of the solar cell, and thermal deformation of the substrate, the second heat treatment may be performed in the chamber 100 maintained at a temperature between about 550 and about 600° C.

In consideration of a predetermined latent period in the formation process of the CIGSS compound and unavoidable performance deterioration of a solar cell due to uneven distribution of gallium (Ga) in the crystalline lattice structure of the CIGSS compound, the second heat treatment may be performed for about 10 to about 60 minutes.

Through the second heat treatment, the second precursor consisting of the first compound, the Cu—Ga layer 35 and the In layer 36 may be bonded with selenium (Se) to form a CIGSS compound layer. The thus formed CIGSS compound layer is the light absorbing layer 30 of the solar cell according to one or more embodiments of the present invention. That is to say, the light absorbing layer 30 of the solar cell according to one or more embodiments of the present invention may be a pentanary compound of copper (Cu), indium (In), gallium (Ga), sulfur (S) and selenium (Se), represented by $Cu_x(Ga_yIn_{1-y})(S_zSe_{1-z})_2$ (where $0.75 \leq x \leq 1$, $0.1 \leq y \leq 0.3$, and $0.7 \leq z < 1$).

In the course of transforming the first compound, the second precursor and selenium (Se) into the CIGSS compound during the second heat treatment, sulfur (S) contained in a higher concentration in the first compound layer than in the second precursor is diffused toward the second precursor. Even if sulfur (S) is diffused from the first compound layer to the second precursor during the second heat treatment, however, the concentrations of sulfur (S) in the first compound layer may be relatively higher than that in the second precursor due to limitation, including a heat treatment time. That is to say, the concentrations of sulfur (S) will gradually decrease from the first compound layer to the second precursor.

In addition, since the $H_2Se$ gas is introduced upwardly with respect to the second precursor, it may be brought into contact with the second precursor more easily than the first compound layer. Thus, the concentration of selenium (Se) in the second precursor will be higher than that in the first compound layer. Accordingly, in the crystalline lattice structure of the CIGSS compound near the first compound layer, a proportion of selenium (Se) replaced partially with sulfur (S) is decreased during formation of the light absorbing layer 30. On the other hand, near the second precursor, the proportion of selenium (Se) replaced partially with sulfur (S) will be increased. Accordingly, during the second heat treatment, as shown in FIG. 3, the concentrations of sulfur (S) in the light absorbing layer 30 will vary by locations of the light absorbing layer 30. In other words, the light absorbing layer 30 includes the first concentration region B' in which the concentration of sulfur (S) gradually decrease in the first direction from the back electrode layer 20 to the light absorbing layer 30.

Meanwhile, as described above according to one or more embodiments, in order to increase the concentration of sulfur (S) between the buffer layer 40 and the first concentration region B' of the light absorbing layer 30, the second heat treatment resulting in the light absorbing layer 30 may be followed by performing a third heat treatment on the light absorbing layer 30 using a sulfur (S) containing gas. As a result, the second concentration region C' in which the concentrations of sulfur (S) increase is formed between the buffer layer 40 and the first concentration region B' of the light absorbing layer 30. That is to say, in the $Cu_x(Ga_yIn_{1-y})(S_zSe_{1-z})_2$ (where $0.75 \leq x \leq 1$, $0.1 \leq y \leq 0.3$, and $0.7 \leq z < 1$) compound of the light absorbing layer 30, values of y gradually increase in the first direction within the second concentration region (C' of FIG. 3B). Since detailed methods and processing conditions of the third heat treatment are substantially the same as those of the first heat treatment, a repetitive explanation thereabout will not be given.

The first compound layer made of the CIGSS compound may be formed at a region between the first concentration region B' of the light absorbing layer 30 and the back electrode layer 20, and the region corresponds to the third concentration region A' in which the concentration of sulfur (S) is relatively higher than in the first and second concentration regions B' and C'. That is to say, the concentration of sulfur (S) is relatively high and the concentration of selenium (Se) is relatively low between the first concentration region B' of the light absorbing layer 30 and the back electrode layer 20, so that the proportion of selenium (Se) replaced with sulfur (S) is relatively reduced in the crystalline lattice structure of the CIGSS compound. Accordingly, the concentration of sulfur (S) of the third concentration region A' corresponds to the maximum among concentrations of sulfur (S) of the first and second concentration regions B' and C'. In addition, the third concentration region A' has substantially the same concentration of sulfur (S) throughout the entire region.

According to one or more embodiments of the present invention, the profile of the band-gap energy Eg of the light absorbing layer 30 may be formed by forming the profile of the concentration of sulfur (S). Therefore, a highly efficient solar cell having an increased open circuit voltage Voc may be fabricated.

In addition, it is possible to minimize formation of $MoSe_2$, which may be formed by a side reaction when the back electrode layer 20 is formed of molybdenum (Mo) during the first heat treatment using a sulfur (S) containing gas. Accordingly, a solar cell may be fabricated, the solar cell having a good crystalline lattice structure in the CIGSS compound while having improved stability.

In order to minimize formation of $MoSe_2$, which tends to be rapidly produced at 500° C. or higher, the heat treatment for forming the CIGSS compound according to one or more embodiments of the present invention may be carried out at about 550° C. or less.

Meanwhile, in order to impart high-quality crystallinity to a CIGSS compound, the heat treatment for forming the CIGSS compound may be performed at about 550° C. or higher. Accordingly, in consideration of both requirements, an appropriate temperature may be selected and the heat treatment for forming the CIGSS compound may be performed at the selected temperature.

According to one or more embodiments of the present invention, the formation of $MoSe_2$ may be minimized using the first compound layer. Therefore, even if heat treatment is performed at 550° C. or higher, since the formation of $MoSe_2$ is minimized, the heat treatment for forming a CIGSS compound may be performed at 550° C. or higher, thereby forming a CIGSS compound having high-quality crystallinity. In addition, since the formation of $MoSe_2$ is minimized, deterioration in the adhesion between the back electrode layer 20 and the substrate 10 due to the formation of $MoSe_2$ may be minimized.

Figure 4I:
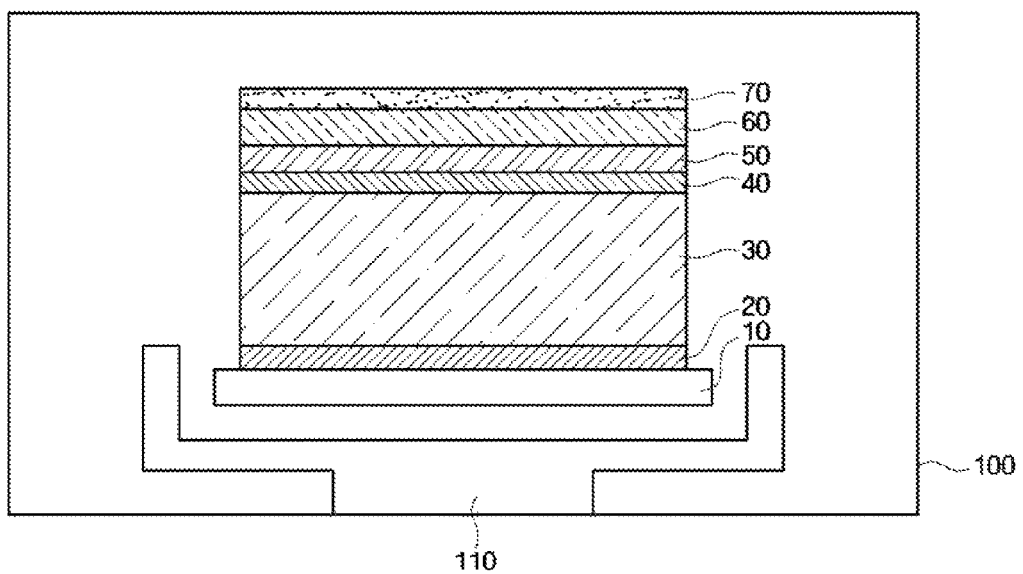

Referring to FIG. 4I, the buffer layer 40 is formed on the light absorbing layer 30. The buffer layer 40 may be formed by a chemical bath deposition (CBD) technique, typically using a CdS based material. The CBD technique using the CdS based material may be performed in the following manner. First, appropriate amounts of $Cd^{2+}$ and $S^{2-}$ ions were prepared in aqueous solutions. Next, in a case where the product of the respective ion concentrations is greater than the product of solubilities of the respective aqueous solutions, temperatures of the respective aqueous solutions are adjusted, precipitating into CdS, thereby forming the buffer layer 40 that may have a thickness of approximately 50 nm.

Referring to FIG. 4I, the window layer 50 is formed on the buffer layer 40. In addition, the transparent electrode layer 60 is formed on the window layer 50. The window layer 50 and the transparent electrode layer 60 may be typically made of zinc oxide (ZnO). Accordingly, the window layer 50 and the transparent electrode layer 60 may be formed using any one coating method, including, for example, RF sputtering using a zinc oxide (ZnO) target, spraying, reactive sputtering using a zinc (Zn) target, or metal organic chemical vapor deposition (MOCVD).

An anti-reflective layer 70 may further be formed on the transparent electrode layer 60. The anti-reflective layer 70 may be formed of $MgF_2$ using an electron-beam physical vapor depositing method.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims. It is therefore desired that the present embodiments be considered in all respects as illustrative and not restrictive, reference being made to the appended claims rather than the foregoing description to indicate the scope of the disclosure.

What is claimed is:

1. A solar cell comprising:
a substrate;
a back electrode layer formed on the substrate;
a light absorbing layer formed on the back electrode layer; and
a transparent electrode layer formed on the light absorbing layer,
the light absorbing layer including copper (Cu), gallium (Ga), indium (In), sulfur (S), and selenium (Se), and including a first concentration region, a second concentration region extending between the first concentration region and the transparent electrode layer, and a third concentration region extending entirely between the first concentration region and the back electrode layer, the third concentration region occupying about 2.5 to 5% of a thickness of the light absorbing layer, wherein:
in the first concentration region, a concentration of sulfur gradually decreases in the light absorbing layer going in a first direction from the third concentration region to the second concentration region, and
the concentration of sulfur is substantially constant throughout the entire third concentration region between the back electrode layer and the first concentration region, the concentration of sulfur of the third concentration region corresponding to a maximum among the concentrations of sulfur of the first concentration region.

2. The solar cell of claim 1, wherein the light absorbing layer is comprised of $Cu_x(Ga_yIn_{1-y})(S_zSe_{1-z})_2$, where $0.75 \le x \le 1$, $0.1 \le y \le 0.3$, and $0.7 \le z < 1$.

3. The solar cell of claim 1, further comprising a buffer layer disposed between the light absorbing layer and the transparent electrode layer.

4. The solar cell of claim 3, wherein, in the second concentration region, a concentration of sulfur gradually increase in the first direction between the first concentration region and the buffer layer.

5. The solar cell of claim 4, wherein the light absorbing layer is comprised of $Cu_x(Ga_yIn_{1-y})(S_zSe_{1-z})_2$, and a value of z gradually increases in the first direction within the second concentration region, where $0.75 \le x \le 1$, $0.1 \le y \le 0.3$, and $0.7 \le z < 1$.

6. A method of fabricating a solar cell, the method comprising:
forming a back electrode layer on a substrate;
forming a light absorbing layer on the back electrode layer; and
forming a transparent electrode layer on the light absorbing layer, the light absorbing layer including copper (Cu), gallium (Ga), indium (In), sulfur (S), and selenium (Se), and including a first concentration region, a second concentration region extending between the first concentration region and the transparent electrode layer, and a third concentration region extending entirely between the first concentration region and the back electrode layer, the third concentration region occupying about 2.5 to 5% of a thickness of the light absorbing layer, wherein:
in the first concentration region, a concentration of sulfur (S) gradually decreases in the light absorbing layer going in a first direction from the back electrode layer to the transparent electrode layer
the concentration of sulfur (S) is substantially constant throughout the entire third concentration region between the back electrode layer and the first concentration region, the concentration of sulfur (S) of the third concentration region corresponding to a maximum among the concentrations of sulfur (S) of the first concentration region, and
the forming of the light absorbing layer includes:
forming a first precursor comprised of copper (Cu), gallium (Ga) and indium (In) on the back electrode layer;
forming a first compound layer corresponding to the third concentration region by performing a first heat treatment on the first precursor using a sulfur (S) containing gas such that the first compound layer occupies about 2.5 to 5% of a thickness of the light absorbing layer;
forming a second precursor comprised of copper (Cu), gallium (Ga) and indium (In) on the first compound layer; and
forming the first concentration region by performing a second heat treatment on the first compound layer and the second precursor using a selenium (Se) containing gas.

7. The method of claim 6, further comprising forming a buffer layer between the light absorbing layer and the transparent electrode layer.

8. The method of claim 6, further comprising performing a third heat treatment using sulfur (S) containing gas to form the second concentration region after the forming of the first concentration region.

9. The method of claim 7, wherein the concentration of sulfur (S) in the second concentration region gradually increases in the first direction between the first concentration region and the buffer layer.

10. The method of claim 6, wherein the sulfur (S) containing gas includes an inert gas and a hydrogen sulfide ($H_2S$) gas.

11. The method of claim 10, wherein the hydrogen sulfide ($H_2S$) gas in the sulfur (S) containing gas has a flow ratio between about 10% and 20%.

12. The method of claim 6, wherein the first heat treatment is performed at a temperature between about 500° C. and about 600° C.

13. The method of claim 6, wherein the selenium (Se) containing gas includes an inert gas and a hydrogen selenide ($H_2Se$) gas.

14. The method of claim 13, wherein the hydrogen selenide ($H_2Se$) gas in the selenium (Se) containing gas has a flow ratio between about 3% and 10%.

15. The method of claim 6, wherein the second heat treatment is performed at a temperature between about 500° C. and about 600° C.

* * * * *